United States Patent [19]

Kawana

[11] Patent Number: 4,987,319

[45] Date of Patent: Jan. 22, 1991

[54] PROGRAMMABLE INPUT/OUTPUT CIRCUIT AND PROGRAMMABLE LOGIC DEVICE

[75] Inventor: Keiichi Kawana, Chiba, Japan

[73] Assignee: Kawasaki Steel Corporation, Hyogo, Japan

[21] Appl. No.: 403,443

[22] Filed: Sep. 6, 1989

[30] Foreign Application Priority Data

Sep. 8, 1988 [JP] Japan .................................. 63-225276

[51] Int. Cl.$^5$ ............................................ H03K 19/177
[52] U.S. Cl. .................................... 307/465; 307/243; 307/468; 307/473
[58] Field of Search ................. 307/243, 448, 451, 465, 307/468–469, 473, 475, 272.2

[56] References Cited

U.S. PATENT DOCUMENTS

| | | | |
|---|---|---|---|
| 4,479,067 | 10/1984 | Fujita | 307/475 |
| 4,680,491 | 7/1987 | Yokouchi et al. | 307/473 X |
| 4,763,020 | 8/1988 | Takata et al. | 307/465 |
| 4,774,422 | 9/1988 | Donaldson et al. | 307/243 X |
| 4,789,951 | 12/1988 | Birkner et al. | 307/465 X |
| 4,808,844 | 2/1989 | Ozaki et al. | 307/243 |
| 4,876,640 | 10/1989 | Shankar et al. | 307/465 X |
| 4,879,481 | 11/1989 | Pathak et al. | 307/468 X |
| 4,894,563 | 1/1990 | Gudger | 307/465 |
| 4,912,345 | 3/1990 | Steele et al. | 307/465 |

FOREIGN PATENT DOCUMENTS 0192875 3/1986 European Pat. Off. .

OTHER PUBLICATIONS

Bursky, D., "Dense Programmable Logic Chips Away at Gate Arrays", Electronic Design, vol. 36, No. 18, Aug. 11, 1988, Hasbrouck Heights, N., pp. 43–58.
Andrews, W. "Architectural and Process Enhancements Deliver Faster, More Flexible PLDs", Computer Design, vol. 27, No. 1, Jan. 1, 1988, Littleton Massachus, pp. 31–42.
Electronic Design, Jul. 11, 1985, pp. 109–118.

Primary Examiner—David Hudspeth
Attorney, Agent, or Firm—Oliff & Berridge

[57] ABSTRACT

In a programmable input/output circuit which is used in a programmable integrated circuit, for interfacing between an external circuit and an internal logic circuit, both disposed exteriorly and interiorly of said integrated circuit, an input/output terminal connected to a bus of the internal logic circuit and a tri-state input buffer are provided, and hereby assured that an external input signal is transmitted to either of the input/output terminal and an ordinary input terminal by switching the status of the tri-state input buffer. In a programmable logic device, which incorporates said input/output circuit, a tri-state buffer is provided between an input/output circuit block and a wiring element, and hereby a driving capability of the wiring element used as a bus line is increased.

9 Claims, 7 Drawing Sheets

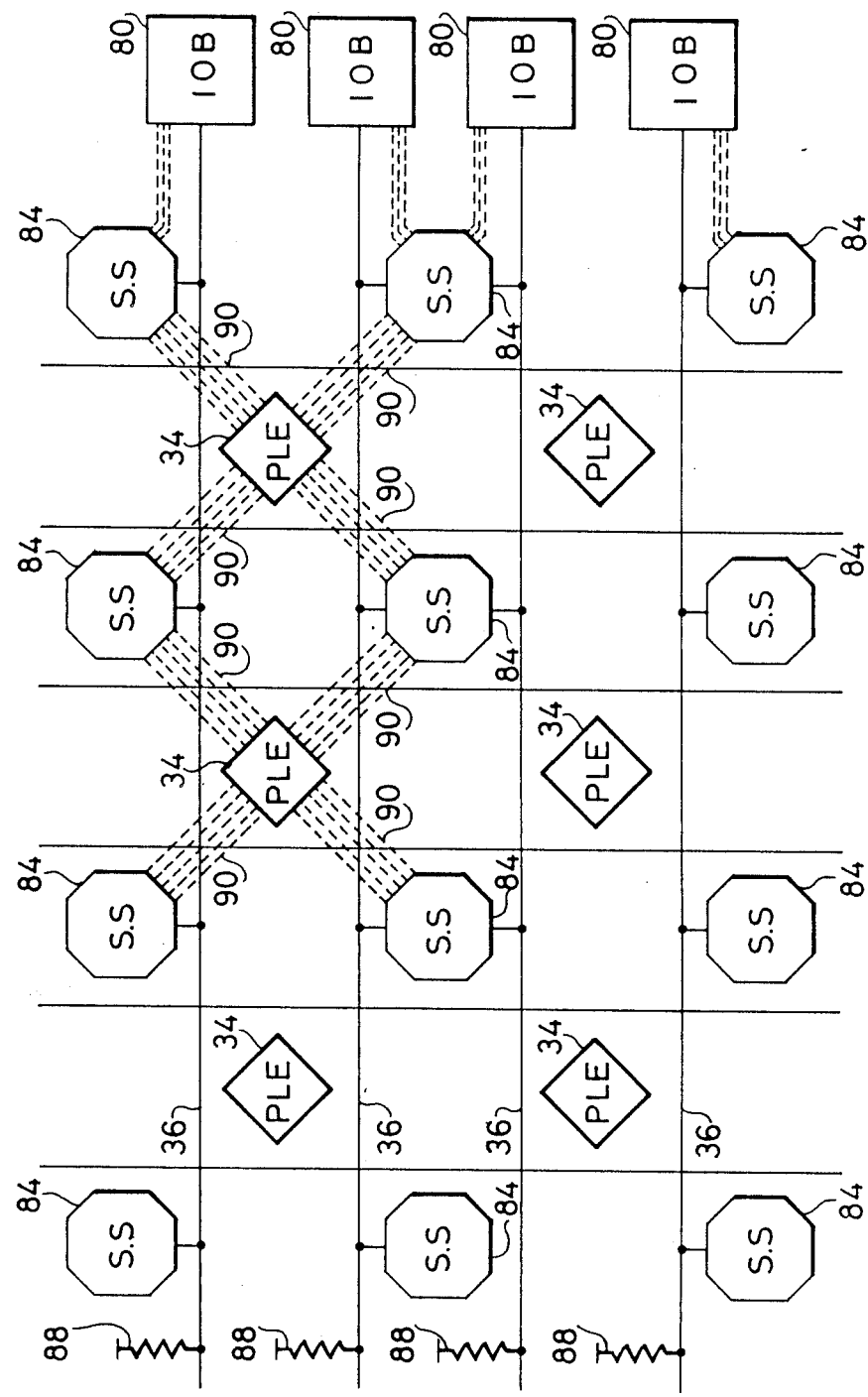
F I G. 5

PROGRAMMABLE INPUT/OUTPUT CIRCUIT AND PROGRAMMABLE LOGIC DEVICE

BACKGROUND OF THE INVENTION

1. Field of the Invention

The present invention relates to a programmable input/output circuit for use in a programmable integrated circuit interfacing between an external circuit and an internal logic circuit, and to a programmable logic device incorporating such an input/output circuit. More specifically, the present invention relates to a programmable input/output circuit being capable of effective signal transfer between buses located interiorly and exteriorly of the programmable integrated circuit and being suitable for use in a programmable logic device with which a user can electrically program an arbitrary circuit of his own, and to a programmable logic device incorporating such a programmable input/output circuit.

2. Description of the Prior Art

A programmable logic device (herinafter, simply referred to as a PLD.) as well known in the art is an integrated circuit adapted to permit a user to establish therewith an arbitrary logic circuit of his own.

The PLD includes primarily a configurable programmable logic element (hereafter, simply referred to as a PLE.) for constructing a user's own logic, a memory cell for defining a circuit function, i.e. for determining the logical function of the PLE and a connection relation among internal wirings in the same, and a programmable input/output block (hereafter, simply referred to as an IOB.) for interfacing between external and internal logic circuits of the PLD.

The IOB 35 includes, as illustrated in FIG. 7 for example, an output terminal 12 connected to a programming wiring in the internal logic circuit, an input terminal 14 connected to a programmable wiring in the internal logic circuit, a pad 16 connected to the external circuit, an input buffer 18 for converting an external signal applied to the pad 16 to an internal logical level by detecting a threshold of the IOB 35 to assure compatibility between a TTL (1.4 V) level and a CMOS (2.5 V) level for example, a D flip-flop 20 of an edge trigger type for example for latching an output from the input buffer 18, a programmable two-input multiplexer 22 for transmitting one of outputs from the input buffer 18 and the D flip-flop 20 to the input terminal 14 in conformity with contents previously stored in a memory cell (not shown), an output buffer 24 for converting to a predetermined driving current an output signal of a high fan-out CMOS or TTL level led to the output terminal 12 and transmitting the converted driving current to the pad 16, and a three-input multiplexer 28 for controlling the output buffer 24 by switching it on and off or by two circuit-function-defining memory cells (not shown), each of which selects a tri-state buffer control in the internal logic circuit or by an IOB output control signal applied to an output control terminal 26.

Additionally, for provision of any bus in the PLD, there is known a technique disclosed for example in "Electronic Design", Jul. 11, 1985, P 111.

The prior PLDs however suffer from some difficulties as follows; there are independently disposed signal lines in which a bus connecting the respective PLEs in the PLD is connected on one side and a bus external to the PLD is connected, on the other side. In addition, an input terminal and an output terminal are separately provided. It is therefore difficult to directly introduce a signal on a bus located on a circuit board (a signal external to the integrated circuit) onto a bus located in the integrated circuit (PLD), and hence the introduction of the former signal is needed to be done utilizing another signal line. It is thus required until now, as illustrated in FIG. 8, upon connecting a bus 31 of an external integrated circuit 30 with a bus 36 of a logic circuit (LEe) 34 in the PLD 32, to first enter an external signal onto a programmable wiring 37 via an IOB 35 as illustrated in FIG. 7 for example and thereafter enter the same signal into the internal logic circuit 34 via the programmable wiring 37 including a switch 38 for switching the state of wiring. This requires many constituent circuit elements, particularly additional relaying elements, followed by time consuming operation, thus making impossible effective signal transfer.

SUMMARY OF THE INVENTION

In view of the drawbacks of the prior techniques, it is an object of the present invention to provide a programmable input/output circuit capable of direct incorporation of a signal from the outside of an integrated circuit onto a bus included in the integrated circuit and a programmable logic device (PLD) including such an input/output circuit.

To achieve the above object, the present invention provides, in one aspect, a programmable input/output circuit for use in a programmable integrated circuit, for interfacing between an external circuit of the integrated circuit and an internal logic circuit of the same, comprising an input/output terminal connected to a bus of the internal logic circuit, an input terminal connected to a programmable wiring of the internal logic circuit, a tri-state input buffer for transmitting an input signal fed externally of the circuit to any one of said input/output terminal and said input terminal, and a tri-state output buffer for transmitting externally of the circuit an output signal from the internal logic circuit fed to said input/output terminal.

The present invention further provides, in the other aspect, a programmable logic device including a programmable input/output circuit block, the programmable logic device comprising an input/output control terminal provided in said input/output circuit block, wiring means capable of programming electrical connection, a tri-state buffer including an enable control input terminal, and wherein the enable control of the tri-state buffer is performed by a control signal generated in said input/output circuit block.

In the first aspect of the present invention, the programmable input/output circuit includes, as illustrated in FIG. 1, an input/output terminal 40 connected to a bus of an internal logic circuit and tri-state buffers 44, 48. An input signal from the outside can be transmitted to any one of the input/output terminal 40 and an input terminal 42 by switching the statuses of the tri-state input buffers 44, 48. Accordingly, the input buffer 44 can transmit the input signal from the outside to the input/output terminal 40, so that the input signal is directly entered into the bus of the internal logic circuit. This assures effective signal transfer between buses located interiorly and exteriorly of an integrated circuit.

If there is no need to directly incorporate a signal from the outside of the integrated circuit into the bus located interiorly of the integrated circuit, then the input buffer 48 could transmit the input signal from the outside to the input terminal 42, assuring the same function as in the prior programmable input/output circuit.

With regard to the second aspect of the present invention, where a programmable logic device (PLD) incorporates the aforementioned programmable input/output circuit, a wiring element 102 located in the PLD 30 will be connected, as illustrated in FIG. 2, to a signal terminal 40 of an input/output circuit block (IOB) 80 typically through an NMOS transistor 104. However, for the wiring elements 102 located in the PLD 30, there are various types in view of the length and flexibility thereof. In particular a PLD, which more advantageously incorporates the programmable input/output circuit according to the present invention, includes therein a bus line. Such a bus line however suffers from a difficulty of its having large floating capacitance, differing from other wiring elements. For this reason, the aforementioned connection through the NMOS transistor 104 causes lowering of an operation speed.

Accordingly, in the PLD according to the present invention, a tri-state buffer 106 is provided between the IOB 80 and the wiring element 102 used as the bus line, as illustrated in FIG. 3, to improve the capacity of driving, and hence improve the operation speed of the device. Thereupon, an enable signal for the tri-state buffer 106 can be supplied from the IOB 80 to define the direction of transmission of an associated signal.

BRIEF DESCRIPTION OF THE DRAWINGS

The exact nature of the present invention, as well as other objects and advantages thereof, will be readily be apparent from condsideration of the following specification relating to the accompanying drawings, in which like reference characters designate the same or similar parts throughout the figures thereof and wherein:

FIG. 5 is a plan view exemplarily illustrating the whole arrangement of the PLD incorporating the programmable input/output circuit according to the present invention;

DESCRIPTION OF THE PREFERRED EMBODIMENTS

In what follows, preferred embodiments of the present invention will be described with reference to the accompanying drawings.

Figure 1:
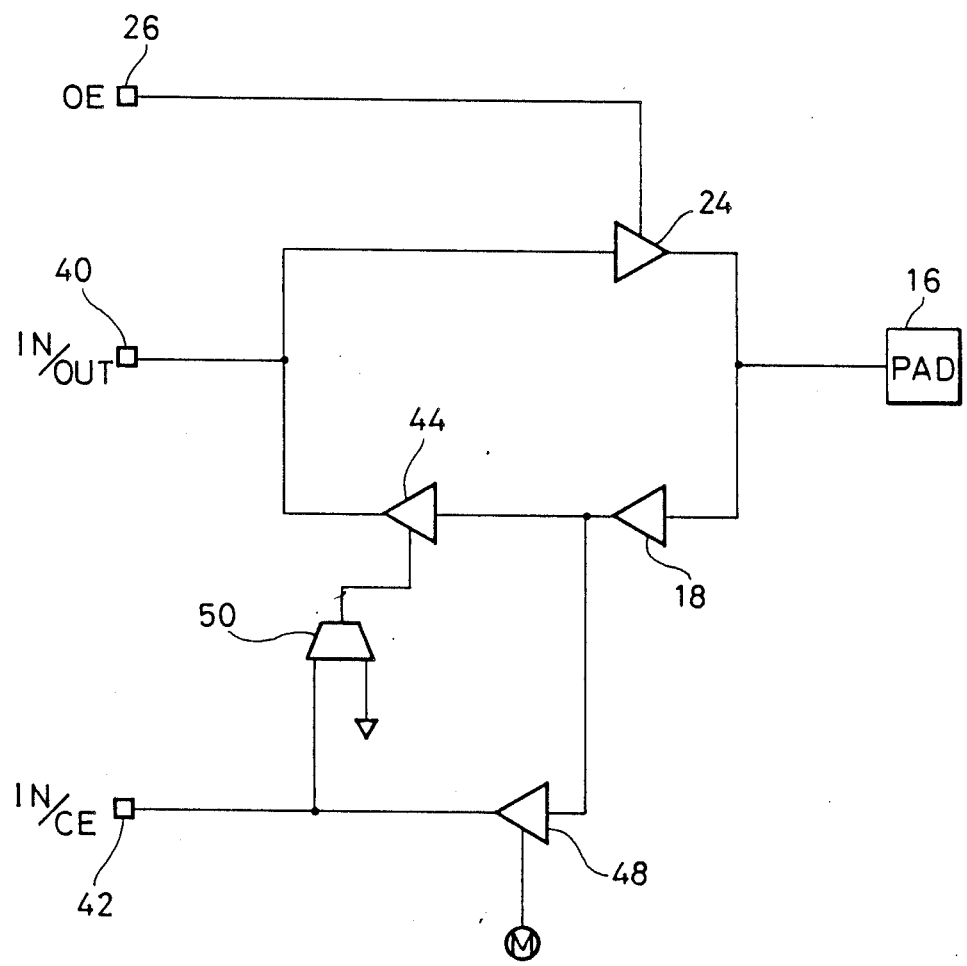
FIG. 1 is a circuit diagram illustrating the arrangement of a first preferred embodiment of a programmable input/output circuit according to the present invention.
Figure 2:
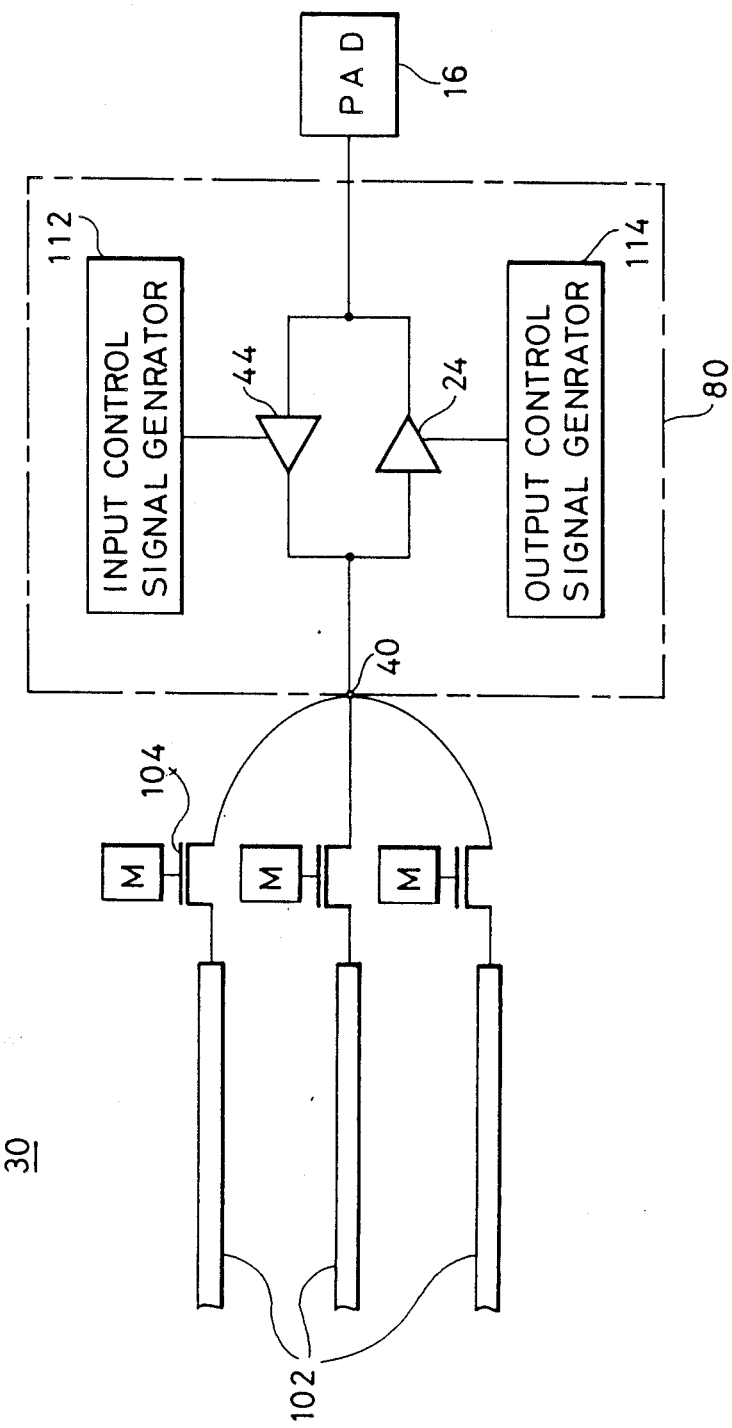
FIG. 2 is a block diagram illustrating the arrangement of an example of comparison with a programmable logic device (PLD) incorporating the programmable input/output circuit according to the present invention.

A first preferred embodiment of a programmable input/output circuit according to the present invention includes, as illustrated in FIG. 1, an input/output (IN/-OUT) terminal 40 connected to a bus of an internal logic circuit, an input (IN/CE) terminal 42 connected to a programmable wiring in the internal logic circuit, a pad 16 connected to an external circuit of an integrated circuit, an input buffer 18 for converting an input signal applied to the pad 16 from a TTL or CMOS logical level to an internal logical level, a first tri-state input buffer 44 for transmitting an output from the input buffer 18 to the input/output terminal 40, a second tri-state input buffer 48 for transmitting the output from the input buffer 18 to the input terminal 42 by being switched on and off by contents stored in a memory cell M composed for example of a non-volatile memory circuit, a two-input multiplexer 50 including therein a memory cell (not shown) for selecting as a status control signal for the input buffer 44, any one of a chip enable (CE) signal and an earth signal or logic low level signal both entered from the input terminal 42, and a tri-state output buffer 24 for transmitting the output signal to the pad 16 fed from the internal logical circuit to the input/output terminal 40 by being switched on and off by an output enable (OE) signal applied from the internal logical circuit to an output control terminal 26.

Operating of the first embodiment constructed as mentioned above will be described.

First, an ordinary situation will be described, where there is no need of directly incorporating an input signal fed externally of the integrated circuit onto the bus located interiorly of the same. In this situation, it is assumed the input buffer 44 has been switched off, and the input buffer 48 has been switched on. The input signal entered into the pad 16 is connected from the input terminal 42 to the programmable wiring in the internal logic circuit through the input buffers 18, 48. In contrast, an output signal from the internal logic circuit is entered into the input/output terminal 40 and outputted to the pad 16 through the output buffer 24 as in the prior case. The output buffer 24 is switched on and off by the OE signal applied from the internal logic circuit to the output control terminal 26.

On the contrary, if there is the need of directly incorporating the input signal fed externally of the integrated circuit onto the bus in the integated circuit, then the input buffer 44 is switched on and the input buffer 48 is switched off. Hereby, the input/output terminal 40 is connected to the bus in the internal logic circuit, and hence an input signal is transmitted from the pad 16 to the internal logic circuit through the input buffers 18, 44, and the input/output terminal 40 while an output signal is being transmitted from the internal logic circuit to the pad 16 through the input/output terminal 40 and the output buffer 24. This establishes effective signal transfer between the buses located interiorly and exteriorly of the integrated circuit.

The first preferred embodiment is arranged as described above in a very simplified arrangement.

It should here be noticed that if no compatibility is required between TTL and CMOS levels, then the input buffer 18 may be neglected.

Figure 4:
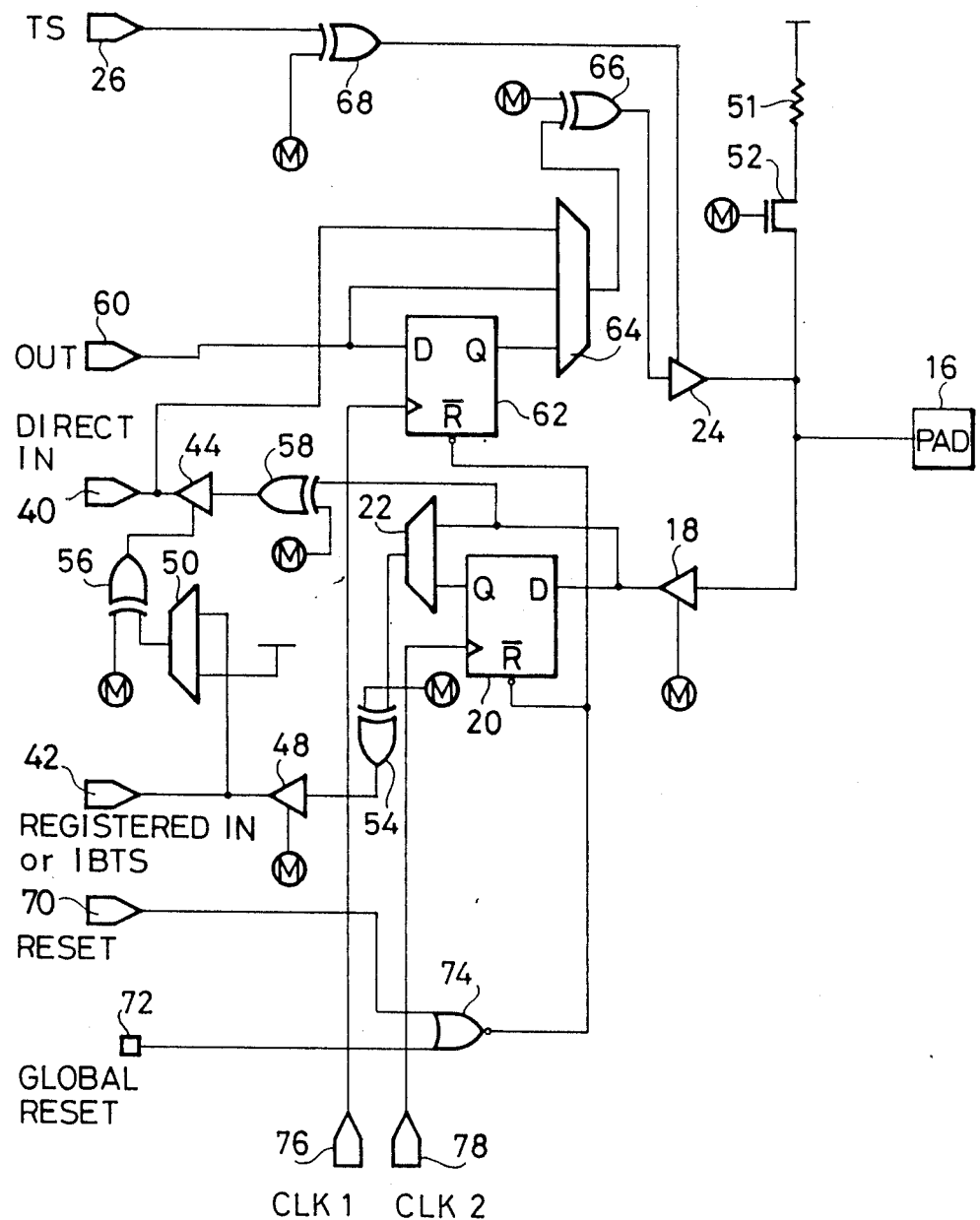
FIG. 4 is a circuit diagram illustrating the arrangement a second preferred embodiment of the programmable input/output circuit according to the present invention.
Figure 6:
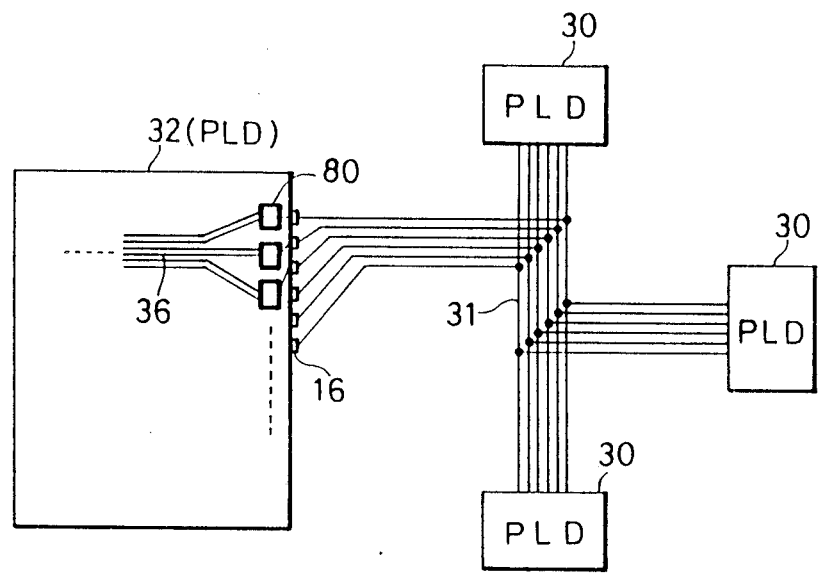
FIG. 6 is a circuit diagram illustrating the situation of connection with an external bus with use of the programmable input/output circuit according to the present invention.
Figure 7:
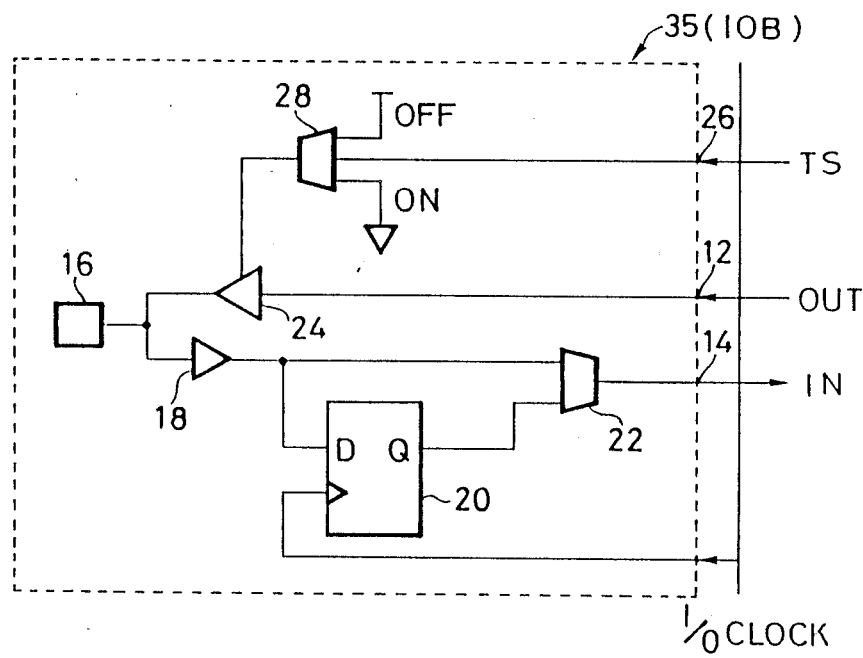
FIG. 7 is a circuit diagram exemplarily illustrating the arrangement of a prior programmable input/output circuit.

In the following, a second preferred embodiment of the programmable input/output circuit according to the present invention will be described in detail with reference to FIG. 4.

The second preferred embodiment of the programmable input/output circuit according to the present invention first includes, as in the foregoing first embodiment, a pad 16, an input buffer 18 including a memory cell M, an output control (TS) terminal 26, an input/output terminal 40 for use in direct transfer of a signal (Direct In), an input terminal 42 for use in ordinary transfer of a signal (Registered In or Internal Bus Tri-State), an input buffer 44, an input buffer 48 including a memory cell M, and a two-input multiplexer 50.

The second embodiment further includes, as its additional features, a pull-up resistor 51 for pulling up the potential of the pad 16 to a power supply voltage upon no input signal, a pass transistor 52 including therein a memory cell M which is to switch the pull-up resistor 51 on and off, a D flip-flop 20 for latching an output from the input buffer 18, a two-input multiplexer 22 for selecting any one of an output signal Q from the D flip-flop 20 and the output from the input buffer 18, an exclusive OR gate 54 including a memory cell M for inverting at need an output from the two-input multiplexer 22 and inputting it into the input buffer 48, an exclusive OR gate 56 including a memory cell M for inverting at need an output from the two-input multiplexer 50 to input it into the input buffer 44 as a status control signal, an exclusive OR gate 58 including a memory cell M for inverting at need the output signal from the input buffer 18 to input it into the input buffer 44, an ordinary output terminal 60 provided independently from the direct connection input/output terminal 40, a D flip-flop 62 for latching an output signal inputted from the output terminal 60, a three-input multiplexer 64 for selectively outputting any one of an output signal Q from the D flip-flop 62 and the output signal from the output terminal 50 or the output signal from the input/output terminal 40, an exclusive OR gate 66 including a memory cell M for inverting at need an output from the three-input multiplexer 54 to input it into the output buffer 24, an exclusive OR gate 68 including a memory cell M for inverting at need the signal applied to the output control terminal 26 to input it into the output buffer 24 as a status control signal, a reset terminal 70 for inputting a reset signal, a reset terminal 72 for inputting a global reset signal, a NOR gate 74 for inputting the logical negation of a logical sum of the signals applied to the reset terminals 70 and 72 into the D flip-flops 20, 62 as a reset signal R, a clock terminal 76 for inputting a first clock signal CLK1 into the D flip-flop 62, and a clock terminal 78 for inputting a second clock signal CLK2 into the D flip-flop 20.

Another arrangement and basic operation of the second embodiment are the same as in the first one, and hence the description will be omitted.

In the second embodiment, there are additionally provided, as described above, the pull-up resistor 51, the latching D flip-flops 20, 62, the signal selecting multiplexers 22, 50, 64, the signal inverting exclusive OR gates 54, 56, 58, 66, 68, the ordinary output terminal 60, and the two clock terminals 76, 78. These additional elements are available in a programmable manner, assuring higher flexibility of the circuit.

As illustrated in FIG. 5, the IOBs 80 according to the present invention are applicable to a programmable integrated circuit including PLEs 34 as internal logic circuits, switching stations (SSs) 84, and buses 36, wherein outputs from the IOBs 80 are directly connected to the respective buses 36 through pull-up resistors 88, for example.

Here, as illustrated in FIG. 5, internal wirings 90 indicated by broken lines interconnect the PLEs 34 with the switching stations 84, respectively.

It should be noted here that the buses 36 and the PLEs 34 disposed in the integrated circuit may be connected through tri-state buffers respectively.

Figure 8:
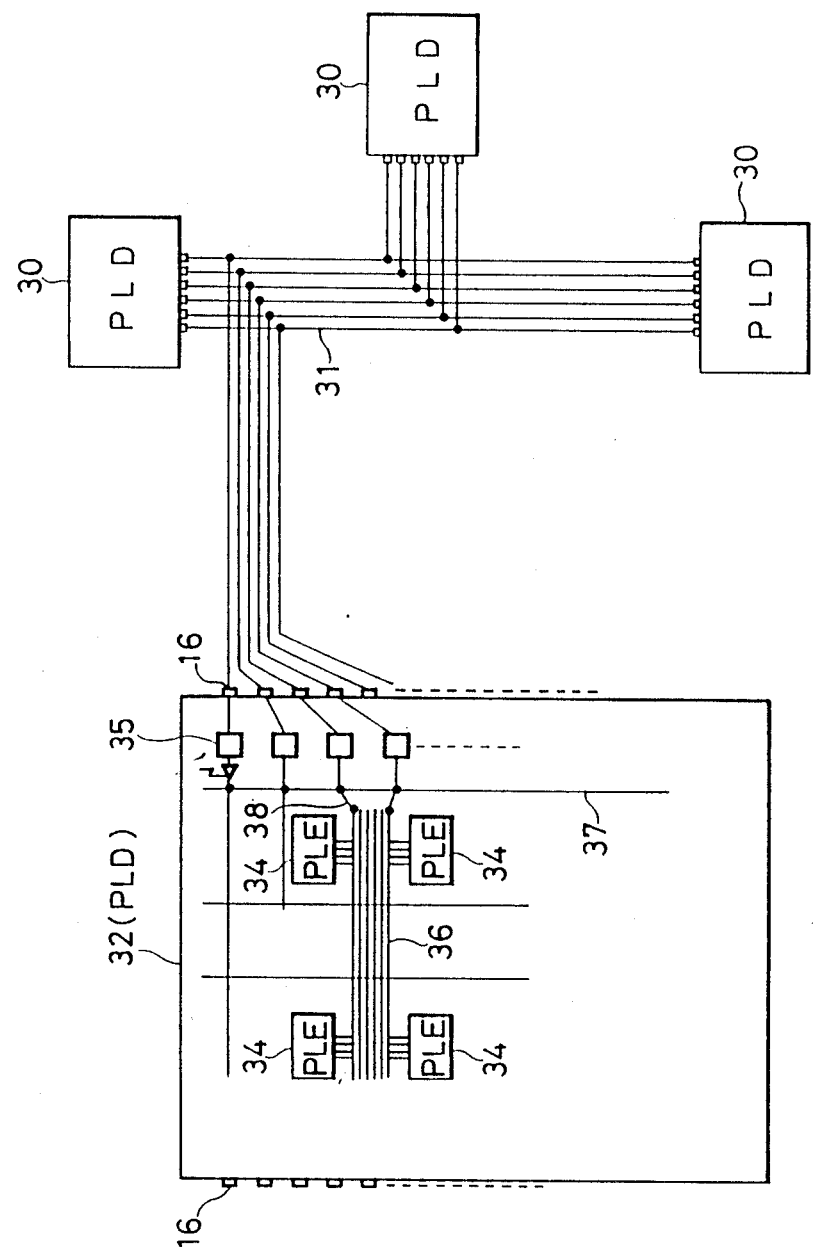
FIG. 8 is a circuit diagram illustrating the situation of connection with an external bus with use of the prior programmable input/output circuit.

In accordance with the programmable input/output circuit of the present invention, the bus 31 connected to the external integrated circuit (PLD) 30 is connected to the bus 36 of the PLE 34 in the PLD 32 only through the IOB 80 of the present invention. Hereby, effective signal transfer can be assured between the buses 36 and 31 located interiorly and exteriorly of the PLD 32 (integrated circuit), differing from the prior example illustrated in FIG. 8.

Finally, a preferred embodiment of a PLD incorporating the programmable input/output circuit according to the present invention will be described.

Figure 3:
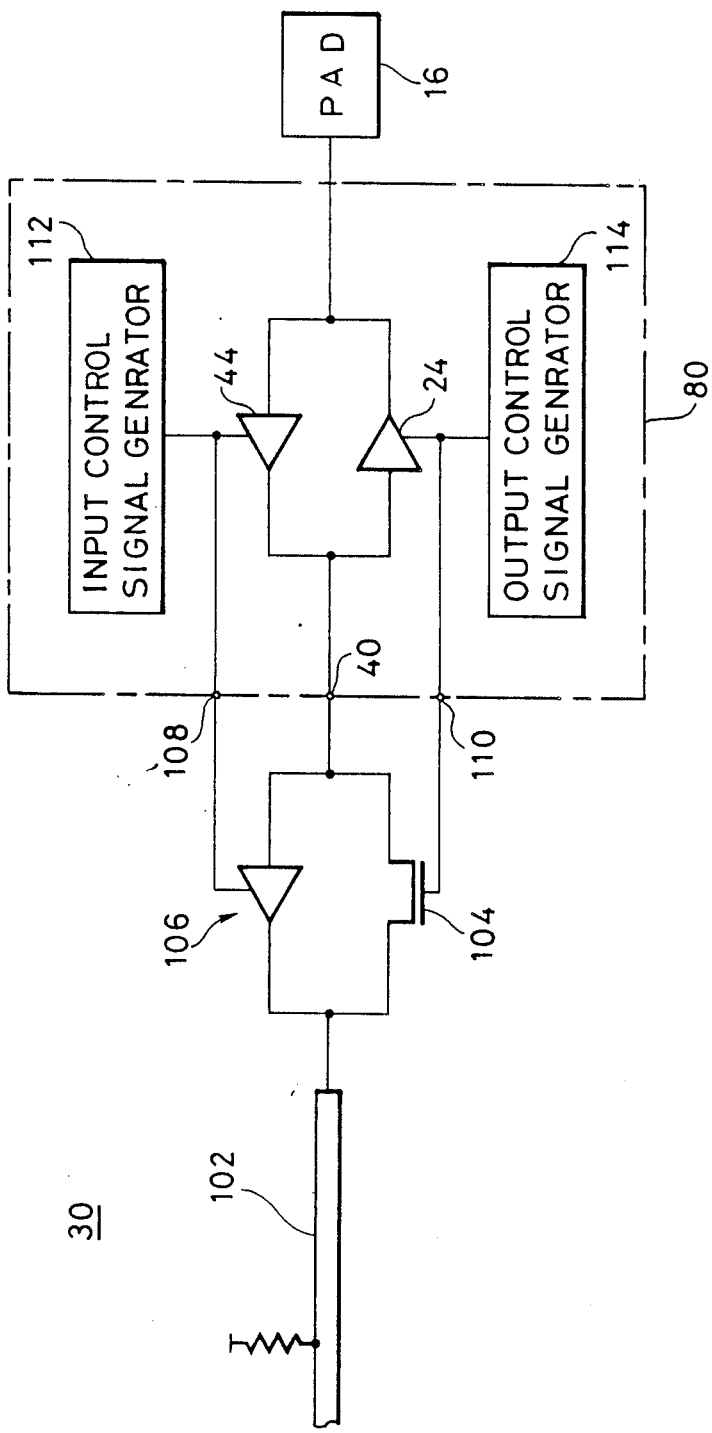
FIG. 3 is a block diagram illustrating the arrangement of a preferred embodiment of the PLD according to the present invention.

A PLD 30 in the present embodiment includes, as illustrated in FIG. 3, an IOB 80, which is comprised of an input control terminal 108, an output control terminal 110, input control signal generator 112, and an output control signal generator 114, a wiring element 102 used as a bus line capable of electrically programming associated connection, and a tri-state buffer 106 including an enable control input terminal. The tri-state buffer 106 is enable-controlled by a control signal generated by the input control signal generator 112 disposed in the IOB 80. Here, designated at 104 is a NMOS transistor.

In accordance with the present embodiment, driving capacity of the wiring element 102 is raised, so that the operation speed of the PLD 30 can be improved.

Although certain preferred embodiments have been shown and described, it should be understood that many changes and modifications may be made therein without departing from the scope of the appended claims.

What is claimed is:

1. A programmable input/output circuit for use in a programmable integrated circuit, for interfacing between an external circuit of the integrated circuit and an internal logic circuit of the same, the programmable input/output circuit comprising:
   (a) an input/output terminal connected to a bus of the internal logic circuit;
   (b) an input terminal connected to a programmable wiring of the internal logic circuit;
   (c) a tri-state input buffer means for transmitting an input signal fed externally of the circuit to any one of said input/output terminal and said input terminal, and
   (d) a tri-state output buffer means for transmitting externally of the circuit an output signal from the internal logic circuit fed to said input terminal.

2. A programmable input/output circuit according to claim 1 further comprising an input buffer which converts said input signal from a TTL or CMOS logical level to an internal logical level, said converted input signal being fed to said tri-state input buffer means.

3. A programmable input/output circuit according to claim 1 wherein said tri-state input buffer means includes a first tri-state input buffer which transmits said input signal to said input/output terminal and a second tri-state input buffer which is switched on and off in conformity with contents stored in a memory cell and which transmits said input signal to said input terminal.

4. A programmable input/output circuit according to claim 3 further comprising a two-input multiplexer including therein a memory cell, the multiplexer selecting any one of a chip enable signal and a logic low level signal entered through said input terminal as a status control signal for said first tri-state input buffer.

5. A programmable input/output circuit according to claim 1 wherein an on/off status of said output buffer means is controlled by an output enable signal applied from the internal logical circuit to an output control terminal.

6. A programmable input/output circuit according to claim 2 further comprising a pull-up resistor selectively connected to a pad through which said input signal is applied to said input buffer and a pass transistor including therein a memory cell, said pass transistor providing the selective connection between said pull-up resistor and said pad.

7. A programmable input/output circuit according to claim 2 further comprising a D flip-flop means for latching various signals from said input buffer and a two-input multiplexer means for selecting any one of an output from said D flip-flop means and an original signal.

8. A programmable input/output circuit according to claim 1, further comprising a first reset terminal for receiving a reset signal, a second reset terminal for receiving a global reset signal, and a NOR gate for outputting to said D flip-flop means as the reset signal the negation of a logicl sum of the signals applied to said first and second reset terminal.

9. A programmable logic device including a programmable input/output circuit block, comprising:
 (a) an input/output control terminal provided in said input/output circuit block;
 (b) wiring means capable of programming electrical connection, said wiring means being connected to a tri-state buffer;
 (c) said tri-state buffer being provided outside said input/output circuit block and including an enable control input terminal, said tri-state buffer being enable-controlled by a control signal; and
 (d) said input/output circuit block including an input control signal generator which generates said control signal.

* * * * *